United States Patent [19]

Goulette et al.

[11] Patent Number: 4,829,238

[45] Date of Patent: May 9, 1989

[54] METHOD AND APPARATUS FOR MONITORING ELECTROMAGNETIC EMISSION LEVELS

[76] Inventors: Richard R. Goulette, 305 Alicia Street, Arnprior, Ontario, Canada, K7S 1H7; Stanilus K. Xavier, 18 Millman Court, Kanata, Ontario, Canada, K2L 2P5; Raymond L. Greenfield, 32 Virgil Road, Nepean, Ontario, Canada, K2H 6B5

[21] Appl. No.: 890,717

[22] Filed: Jul. 30, 1986

[30] Foreign Application Priority Data

Mar. 27, 1986 [CA] Canada ................................. 505485

[51] Int. Cl.⁴ ...................... G01R 21/04; G01R 31/02
[52] U.S. Cl. ................................. 324/95; 324/73 PC; 324/158 F; 324/158 P; 324/72.5
[58] Field of Search .............. 324/95, 73 PC, 158 F, 324/158 P, 72, 72.5; 340/825.34, 701, 703, 525, 728; 343/703

[56] References Cited

U.S. PATENT DOCUMENTS

| | | | |
|---|---|---|---|
| 2,509,045 | 5/1950 | Salisbury | 343/703 |
| 3,327,212 | 6/1967 | Taub et al. | 324/95 |
| 3,750,017 | 7/1973 | Bowman et al. | 324/72 |
| 3,810,138 | 5/1974 | Thompson et al. | 340/728 |
| 3,848,188 | 11/1974 | Ardezzone et al. | 324/73 AT |
| 3,848,189 | 11/1974 | Pope | 324/95 |
| 4,097,797 | 6/1978 | Finet | 324/73 R |
| 4,354,153 | 10/1982 | Lentz | 324/95 |
| 4,587,481 | 5/1986 | Lischke et al. | 324/73 PC |
| 4,706,021 | 11/1987 | Chamuel | 324/242 |

OTHER PUBLICATIONS

IBM Technical Disclosure Bulletin, vol. 19, No. 8, Jan. 1977, p. 3182, New York, U.S.; A. H. Nay et al.: Test System for Logic Cards.

Primary Examiner—Reinhard J. Eisenzopf
Assistant Examiner—Vinh P. Nguyen
Attorney, Agent, or Firm—Foley & Lardner, Schwartz, Jeffery Schwaab, Mack, Blumenthal & Evans

[57] ABSTRACT

Electromagnetic emission from a printed circuit board is monitored by energizing the board while it is located adjacent an array of electromagnetic emission measuring probes. The probes are successively addressed and currents induced in the probes are measured at a receiver. A memory map of the electromagnetic emission as a function of board position is generated and is displayed together with the circuit board layout so that regions of high emission level can be identified in the circuit. Each probe of the array is a series connected pair of wire loops, the planes of the loops being perpendicular to each other and to the plane of the array.

25 Claims, 3 Drawing Sheets

METHOD AND APPARATUS FOR MONITORING ELECTROMAGNETIC EMISSION LEVELS

BACKGROUND OF THE INVENTION

1. Field of the Invention

This invention relates to a method and apparatus for locating sources of high levels of electromagnetic emission in printed circuit boards and similar circuit packages.

2. Related Art

Communications regulatory authorities in many countries have introduced regulations requiring that electromagnetic emissions from computing equipment and other digital equipment be limited in order to prevent electromagnetic interference to licensed radio communications. For example, in the U.S.A., the Federal Communications Commission has introduced Part 15, Subpart J of the FCC Rules which specifies test methods and limits.

One way of limiting emission is by mounting the equipment in a shielded enclosure which acts as a Faraday cage. This can prove expensive because of the numerous measures to ensure that the shield is not compromised by electromagnetic leakage through enclosure openings or external electrical connections. Thus special conductive gaskets to electrically join panels, and radio-frequency filtering of all wiring leaving the equipment may be required. A cheaper method in the long term is to ensure that the various electrical and electronic components within the equipment do not in fact generate high levels of electromagnetic emission. An important tool in circuit board design is therefore a method for easily and accurately locating and measuring the electromagnetic emission from an operating circuit board.

Using a known system, a prototype circuit board package is placed in an environment such as an anechoic chamber devoid of any electromagnetic interference. A monitoring device is then set up in spaced relationship to the circuit board or equipment to ascertain the gross electromagnetic emission.

This does not really assist in determining exactly where on the circuit board the electromagnetic emission is high. For this a more localized monitor is required.

SUMMARY OF THE INVENTION

According to one aspect of the invention there is provided a method of testing a body for electromagnetic emission therefrom, the method comprising positioning an array of electromagnetic emission monitoring probes occupying predetermined positions within the array immediately adjacent to the body, successively addressing the probes to measure detected current induced in the probes by electromagnetic emission from respective immediately adjacent regions of the body, and analyzing electrical outputs from the probes to obtain a position-dependent measure of electromagnetic emission levels immediately adjacent to the body.

Particularly for testing a circuit board for electromagnetic emission therefrom, the method can further comprise energizing a circuit supported by the circuit board, addressing an electromagnetic emission monitoring probe located immediately adjacent the board at successive locations in a grid thereof extending parallel to the board, measuring the current induced in each of the probes during an address period using a receiver tuned to a predetermined frequency, directing circuit layout design data to a controller, operating the controller to illustrate the circuit layout at a visual display unit, directing said peak current data to the controller, and operating the controller to illustrate a corresponding electromagnetic emission map at the visual display unit.

The method can further comprise generating a contour map having contour lines joining identical electromagnetic emission levels, and then displaying both said contour map and said circuit layout design at the display mans whereby emission levels can be related to specific elements of the circuit. Alternatively, the method can comprise generating a colour coded map, each of the displayed colours denoting a predetermined level of electromagnetic emission and similarly displaying the colour map and the circuit layout design.

According to another aspect of the invention there is provided apparatus for testing a body for electromagnetic emission therefrom, the apparatus comprising an array of electromagnetic emission monitoring probes; addressing means for successively addressing the probes of the array; a receiver connected to said addressing means for measuring current induced in the monitoring probes by electromagnetic emission from the body when located immediately adjacent to the array; controller means for developing a memory map of electromagnetic emission from the body; and display means for displaying said map whereby the level of electromagnetic emission is related to locations on the body.

Particularly for testing a circuit board for electromagnetic emission therefrom, the apparatus can further include a memory at which circuit layout design data is stored, and means for inputting said circuit layout design data to the controller means said display means operable simultaneously to display said memory of electromagnetic emission from the circuit board and said layout of the circuit whereby the level of electromagnetic emission is related to elements of the circuit.

Preferably the probes are located in an XY lattice, the XY lattice having a plurality of column conductors and a plurality of row conductors with the probes located at intersections between the row and column conductors. Said means for addressing the probes can comprise decoder and driver circuits associated with each of the column and row conductors. The apparatus can further include a signal processor for digitizing an output from the receiver.

Preferably the apparatus includes a microprocessor controller for developing the memory map and for producing an output signal to the visual display unit for simultaneously displaying said map and circuit layout.

The probes can each comprise a pair of wire loops, the loops of each pair electrically connected in series with one another and with a switch whereby a particular probe is only addressed when both the column and row conductors intersecting at the probe are energized. The switches can comprise switching or PIN diodes. The probes can be received in recessed portions of a supporting board for supporting the probe array. The board can have a thin dielectric layer overlying the probed array for physical protection and a number of layers of connector metallization. In order to conduct received signal to the receiver, the probes can be interconnected by strip line interconnect.

An embodiment of the invention will now be described by way of example with reference to the accompanying drawings in which:

DETAILED DESCRIPTION OF THE EMBODIMENT

Figure 1:
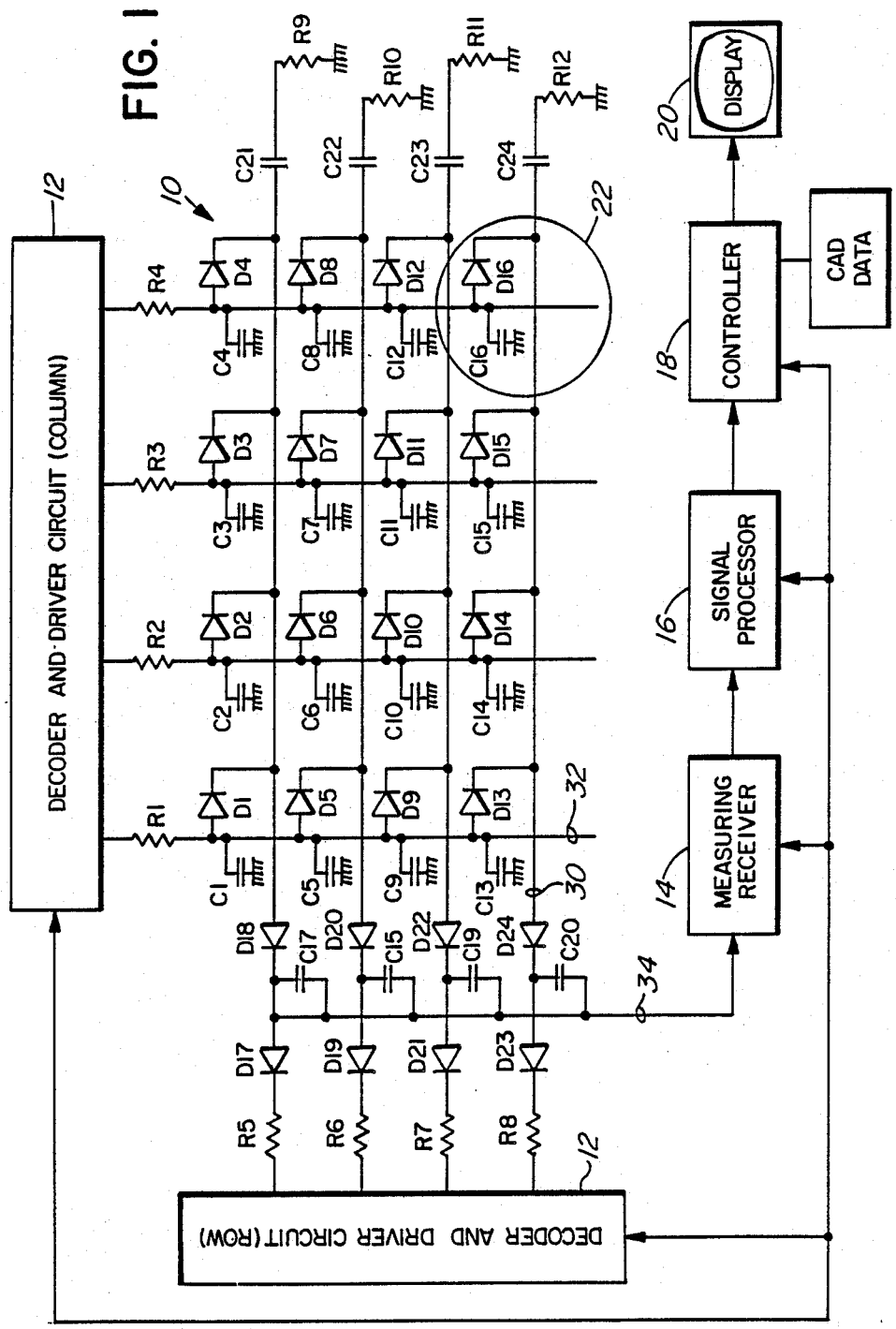
FIG. 1 is a block schematic drawing of electromagnetic emission monitoring apparatus according to the invention.

Referring to the drawing in detail, FIG. 1 shows a block diagram of an electromagnetic emission scanning system. The system has a probe array 10 driven by decoder and drive circuits 12, a measuring receiver 14, a signal processor 16, a controller 18, and a visual display unit 20. The probe array has a series of probes 22 packed in an XY grid array.

Figure 2:
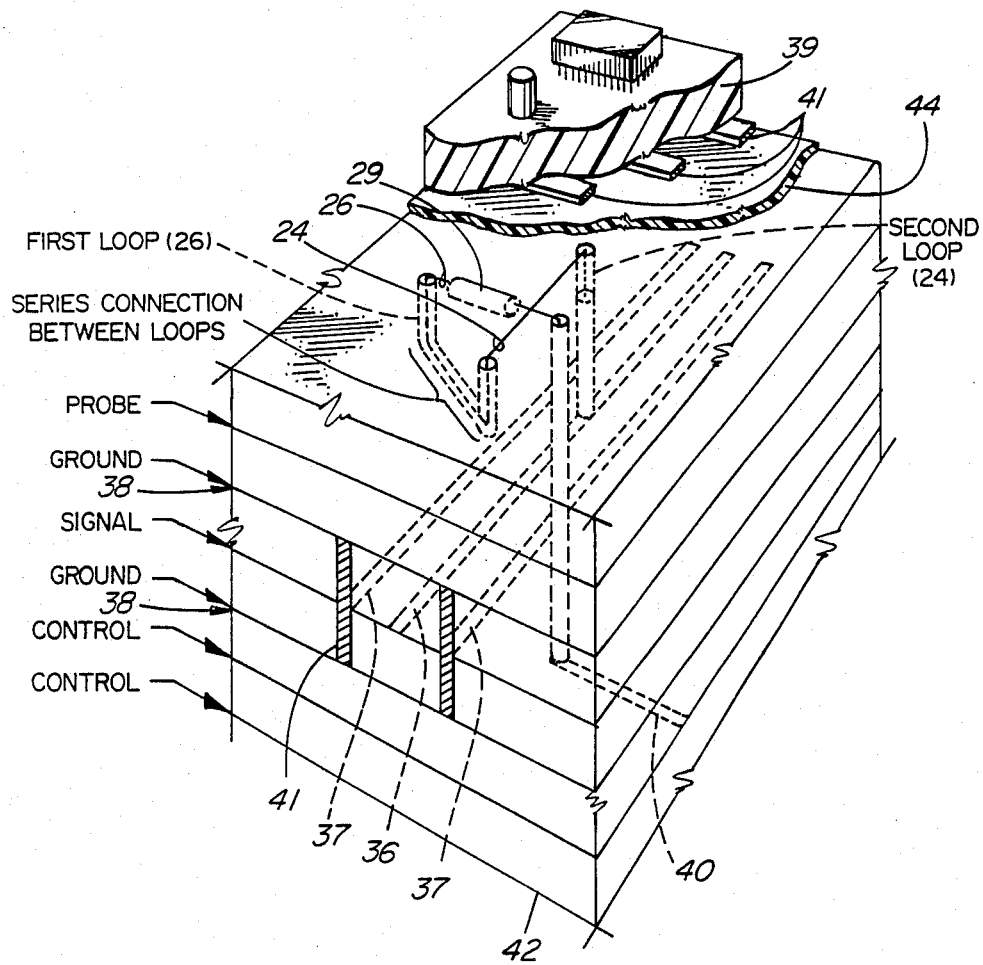
FIG. 2 is a schematic perspective view, not to scale, showing one probe of a scanning array thereof forming part of the apparatus.

As shown in FIG. 2, the probe array is supported by a body in the form of a multilayer supporting board 50. Each probe consists of two serially connected wire loops 24, 26, the wire loops being mounted with their planes perpendicular to the plane of the array (horizontal as shown) and mutually perpendicular to one another. A current is induced in each loop which is proportional to electromagnetic flux in a direction perpendicular to the plane of the loop. The area of each loop is a compromise between a large area required for probe sensitivity and a small area enabling more probes to be packed into the array so as to increase the resolving capability of the scanner. A suitable compromise area is 0.04 square inches. The crossed probes are used in order to provide an omnidirectional characteristic.

Although not described in this embodiment, a further loop mounted perpendicular to the other loops, can be used to measure electromagnetic emission perpendicular to the plane of the array. A single loop may be used for measuring in a single direction.

A circuit board package 39 to be tested is positioned close to the scanning array so that changing magnetic fields generated by currents within board conductors 41 induce corresponding currents in the probes 22. These induced currents are measured by the receiver 14. The array of probes is scanned electronically using the decoder and driver circuits 12, each probe 22 in turn being connected to the receiver.

Normally the electromagnetic emission scan is performed for a range of frequencies. Priority is given to those signals on the board having the fastest repetition rates. Only those signal harmonic frequencies which fall within the range of the specific application need be considered (e.g. 30 MHz to 1000 MHz for FCC Part 15J requirements). Alternatively, the total radio-frequency radiated emissions of the circuit board may be measured by conventional means using a radio receiver and an antenna at a distance, and the frequencies of emissions having the highest amplitude selected for board scans.

The receiver 14 is first tuned to a particular frequency at which electromagnetic emission is to be measured. Current induced in an addressed probe 22 develops a voltage across a terminating input impedance of the receiver. The receiver has variable bandwidth, e.g. 10 KHz and 120 KHz, and detection levels (peak or average) selectable for measuring electromagnetic emission at different frequencies.

The output of the receiver is passed to the signal processor 16 where it is digitized into a form suitable for input to the controller 18.

The controller 18 carries out necessary housekeeping tasks such as addressing the probes 22 of the row column array in sequence. It also sets up the parameters of the receiver such as frequency, bandwidth and detection mode (amplitude or frequency modulation). In addition, it instructs the signal processor 16 in its digitization of the signal from the receiver. Lastly, the controller 18 formats for input to the visual display unit 20 according to whether the displayed map is required in contour or colour form.

Selection of each probe 22 is achieved by means of a diode matrix arrangement. A switching or PIN diode 29 such as D16 (FIG. 1) is serially connected to the loops at each probe. A particular probe at a row/column intersection is selected by applying a positive voltage to one of the columns 32 and a negative voltage to the appropriate row 30 to turn on the associated diode 29. Current induced in a selected probe, for example the probe indicates at reference numeral 22 in FIG. 1, flows to the left along the row 30 through D24 and C20 to a collector bus 34 and to the receiver 14. The path followed from the selected probe 22 to the measuring receiver 14 is of controlled impedance, typically 50 ohms. At high frequencies, above 20 MHz, the length of each row 30 becomes an appreciable part of a wavelength. To avoid fluctuations in the received signal from signal reflections, the rows 30 are terminated by an impedance such as R11 equal to the characteristic impedance of the transmission line, typically 50 ohms.

The signal is carried from the probes 22 by means of strip line 36, the strip line having flanking ground tracks 37 bonded to upper and lower ground planes 38 by vias 41 at frequent intervals, typically every 0.3 inches. One end of each probe is AC grounded by means of a capacitor such as C9. This is a surface mount type of capacitor which provides a high self-resonant frequency.

Control signals for selection of the probes are carried on lower layers 40, 42 of the multilayer supporting board 50. In use, the printed circuit pack 39 is placed track side down (component side up) on top of the probe array but separated from the probes by a thin insulating layer 44 to prevent electrical shorts. The printed circuit pack under test is subjected to signal and supply voltages to be expected in normal operation. The array is then scanned, one probe at a time, and the magnitude of the output from each probe is measured at the receiver 14. The output of the receiver is then processed and passed to the controller 18. A memory map is generated at the controller and is displayed coincidentally with computer aided design (CAD) data for the particular board. The data is formatted so as to show the various levels of electromagnetic emission as different colours or different contour lines. Consequently the circuit elements responsible for high emission levels can be identified.

The invention has particular application at the circuit board design stage but can be used also in production control to avoid the fabrication of boards having unusually high levels of electromagnetic emission.

The scanning apparatus described has applications additional to measuring EMI emissions for printed circuit boards.

The apparatus can, for example, be used in the fault diagnosis of printed circuit boards. Each printed circuit board (PCB) when energized and exercised, has its own characteristic electromagnetic signature (or contour map) as measured by the electromagnetic scanning system. For a given type of PCB, any fault in the circuit conductors or components can cause this signature to be altered. This happens because signal currents are either interrupted (e.g. by open circuits), diverted (by short circuits), or otherwise changed in amplitude or waveshape by malfunctioning components. By comparing the signature from a PCB under test with a reference signature obtained from a PCB known to be good, the location and nature of the fault may be deduced.

It the fault exists on parts of the circuitry operating at DC or at very low frequencies where the EM scanner is not sensitive, use is made of a tracer signal of appropriate frequency injected into the circuit in questions. The scanner is operated to map the path followed by this signal to aid in fault diagnosis. An example of this technique is to inject a tracer signal current between a power supply and ground terminals of a PCB to help trace the location of a possible circuit between these signals.

The apparatus can also be used in electromagnetic shielding evaluation. Good electromagnetic shielding requires that the shielding material (particularly thin, conductive coatings applied to plastic equipment housings) be free of flaws such as cracks and thin areas. Also, where joints occur between shielding panels, the electrical bonding must be continuous. If such a shield is energized with a radio-frequency current from an external generator, areas of RF leakage at these flaws are prominently displayed and localized using the scanner display.

Similarly, flaws in metal coatings or sheets can be detected by the scanner if the samples are suitably energized with RF energy. This is accomplished by injecting RF currents through the samples under test or by illuminating the samples with external RF radiation and then observing the resulting pattern of RF current flow on the sample surface using the scanner. Flaws such as cracks or badly bonded metal panels show up as anomalies on the visual display.

In another application, the scanner is operated in reverse. The scanner port which is normally connected to the receiver is instead connected to a source of RF energy such as a signal generator. When the scanning circuitry is operated, the applied signal causes RF currents to sequentially flow in each individual RF probe on the scanner head. In effect, the scanner operates in reverse, causing localized RF magnetic fields to be generated at probe positions. The scanner head is placed in close contact with a PCB known to be sensitive or susceptible to RF, and the precise time of occurence of any PCB disturbance or malfunction is monitored. This is related to the particular probe of the scanner which is being energized at that time. This technique is used to generate a map of PCB sensitivity to RF.

Depending on the particular application, appropriate adjustment can be made of the RF receiver sensitivity and bandwidth selection. The receiver can be designed to respond to amplitude or frequency modulation. Alternatively, a peak, average, RMS or logarithmic response signal detector can be used.

As previously indicated, the display can show different emission levels as different colours, colour levels, as a contour map, colour intensity modulated map, or a simulated three-dimensional graph. Known image processing techniques can be used to increase the apparent resolution of the displayed image or to enhance its contrast or information-to-noise ratio. The display intensity or colour corresponding to each probe location can be binary to indicate a pass/fail situation or it can consist of many quantized steps or levels corresponding to a continuous measurement of some parameteer of the circuit under test.

Figure 3:
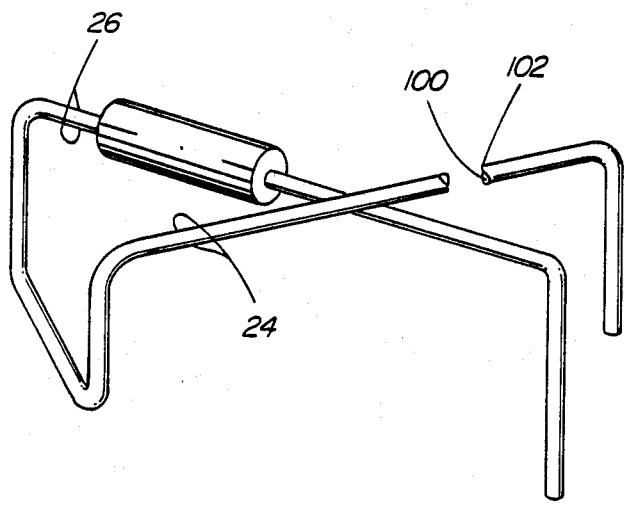
FIG. 3 is a view of the probe with serially connected wire loops.

Finally, in the scanner itself, the probe size, aspect ratio, and number of turns of the loops can be selected according to the particular application. Optionally, as shown in FIG. 3 the probe wires can have magnetic cores 100 to increase probe sensitivity to low frequency electromagnetic fields or an electric field shielding layer 102 to exclude the interfering effects of unwanted electric fields. Although the scanner described has a planar rectangular probe array, the scanner is not restricted to this shape and, depending on its application, can be cylindrical, spherical, or disc-shaped.

What is claimed is:

1. A method of testing a body for electromagnetic emission therefrom, the method comprising the steps of positioning a plurality of electromagnetic emission monitoring probes in predetermined positions immediately adjacent to the body, successively addressing the probes to measure detected current induced in the probes by electromagnetic emission from respective immediately adjacent regions of the body, analyzing electrical outlets from the probes to obtain a measure of electromagnetic emission levels associated with each predetermined position immediately adjacent to the body and displaying a map of said measures with each measure displayed at a position on the map corresponding to the associated predetermined position.

2. A method for testing a circuit board for electromagnetic emission therefrom, the method comprising the steps of energizing a circuit supported by the circuit board, successively addressing electromagnetic emission monitoring probes located immediately adjacent the board at predetermined locations in a grid thereof extending parallel to the board, measuring the current induced in each of the probes by electromagnetic emission from respective immediately adjacent regions of the body during an address period using a receiver tuned to a predetermined frequency, directing circuit layout design data to a controller, operating the controller to illustrate the circuit layout at a visual display unit, directing a value of said measured current to the controller, and operating the controller to illustrate the circuit layout at a visual display unit, directing said value of measured current to the controller, and operating the controller to illustrate a map of electromagnetic emissions corresponding to said circuit layout at the visual display unit.

3. A method as claimed in claim 2, wherein the step of displaying a map further comprises generating a contour map having contour lines joining identical electromagnetic emission levels, and displaying said contour map.

4. A method as claimed in claim 2, wherein the step of displaying a map further comprises generating a colour coded map, each of the displayed colours denoting a predetermined range of electromagnetic emission levels and, displaying said colour coded map.

5. Apparatus for testing a body for electromagnetic emission therefrom, the apparatus comprising:
an array of electromagnetic emission monitoring probes;
addressing means for successively addressing the probes of the array;

a receiver connected to said addressing means for measuring current induced in the monitoring probes by electromagnetic emission from locations on the body immediately adjacent to the array;

controller means for developing a memory map of electromagnetic emission from the body; and display means for displaying said electromagnetic emissions memory map whereby levels of electromagnetic emissions are related to locations on the body.

6. Apparatus as claimed in claim 5 particularly adapted for testing a circuit board for electromagnetic emission therefrom, the apparatus further comprising a memory at which circuit layout design data is stored, and means for inputting said circuit layout design data to the controller means said controller means operable to generate a circuit layout map from the circuit layout design data said display means being operable simultaneously to display said memory map of electromagnetic emission from the circuit board and said circuit layout map whereby the level of electromagnetic emission is related to elements of the circuit with said maps superimposed.

7. Apparatus as claimed in claim 5 wherein the probe array is planar.

8. Apparatus as claimed in claim 7 in which a pair of such loops are electrically connected in series and wherein the plane of the two loops are perpendicular to one another and to the plane of the array.

9. Apparatus as claim in claim 8, further comprising a respective switch in series with each of the probes, the switch being located at an intersection between an X and a Y probe addressing line, the switch actuated when an energizing voltage is applied simultaneously to the X and Y lines.

10. Apparatus as claimed in claim 9, wherein the switches are diodes.

11. Apparatus as claimed in claim 5, wherein a plurality of such probes are fixed in an XY lattice.

12. Apparatus as claimed in claim 11, the XY lattice having a plurality of column conductors, a plurality of row conductors, and probes at intersections between the row and column conductors, the apparatus further comprising a first decoder and driver circuit associated with the column conductors and a second decoder and driver circuit associated with the row conductors, the decoder and driver circuits adapted to take instructions from the controller means and to convert them to a voltage applied to successive conductors of the row/column probe array.

13. Apparatus as claimed in claim 5, wherein the probes are received in recessed portions of a supporting board for supporting the probe array.

14. Apparatus as defined in claim 5, wherein the receiver is tunable to selected frequencies and has a variable bandwidth which is adjustable to selected frequency bands.

15. Apparatus for testing a body for electromagnetic emission therefrom, the apparatus comprising:

an array of electromagnetic emission monitoring probes;

addressing means for successively addressing the probes of the array;

a receiver connected to said addressing means for measuring current induced in the monitoring probes by electromagnetic emission from locations on the body immediately adjacent to the array;

controller means for developing a memory map of electromagnetic emission from the body;

displaying means for displaying said electromagnetic emissions memory map whereby levels of electromagnetic emissions are related to locations on the body;

wherein the probes are interconnected by strip line interconnect.

16. Apparatus for testing a body for electromagnetic emission therefrom, the apparatus comprising:

a planar array of electromagnetic emission monitoring probes each of the probes having at least one wire loop;

addressing means for successively addressing the probes of the array;

a receiver connected to said addressing means for measuring current induced in the monitoring probes by electromagnetic emission from the body when located immediately adjacent to the array;

controller means for developing a memory map of electromagnetic emission from the body; and display means for displaying said electromagnetic emissions memory map whereby levels of electromagnetic emissions are related to locations on the body.

17. Apparatus as claimed in claim 16 wherein the probe wire has a magnetic core to increase probe sensitivity to low frequency magnetic fields.

18. Apparatus as claimed in claim 16 wherein the probe wire has an electric field shielding outer layer.

19. Apparatus for testing a body for electromagnetic emission therefrom, the apparatus comprising:

an array of electromagnetic emission monitoring probes;

addressing means for successively addressing the probes of the array;

a receiver connected to said addressing means for measuring current induced in the monitoring probes by electromagnetic emission from the body when located immediately adjacent to the array;

controller means for developing a memory map of electromagnetic emission from the body;

display means for displaying said electromagnetic emissions memory map whereby levels of electromagnetic emissions are related to locations on the body; and a thin dielectric layer overlying the probe array.

20. A method for testing a body for electromagnetic emission therefrom comprising the steps of:

(a) positioning an electromagnetic monitoring probe in successive positions of a planar array extending parallel to an adjacent body undergoing test;

(b) addressing said probe at each said position in said array;

(c) at each said array position measuring a current induced in said probe by electromagnetic emissions from the adjacent body;

(d) developing a memory map of said emissions at said array positions; and (e) displaying said electromagnetic emissions memory map and relating levels of electromagnetic emissions to locations on said adjacent body.

21. A method for testing a body for electromagnetic emission therefrom, comprising the steps of:

(a) placing a body to be measured adjacent to an electromagnetic monitoring probe array;

(b) successively addressing and connecting a receiver to each said probe in said array;

(c) for each said connection measuring current induced in said probe by electromagnetic emission from said adjacent body;

(d) developing a memory map of said electromagnetic emission from said body; and (e) displaying said electromagnetic emissions memory map whereby levels of electromagnetic emissions are related to locations on said body.

22. A method for testing a body for electromagnetic emissions therefrom as recited in claim 21 further comprising placing a thin dielectric layer overlying said probe array.

23. A method for testing a body for electromagnetic emission therefrom comprising the steps of:

(a) forming at least one electromagnetic monitoring probe, said probe having at least one wire loop, (b) positioning said electromagnetic monitoring probe in successive positions of a planar array extending parallel to an adjacent body undergoing test;

(c) addressing said probe at each said position in said array;

(d) at each said array position measuring a current induced in said probe by electromagnetic emissions from the adjacent body;

(e) developing a memory map of said emissions at said array positions; and (f) displaying said electromagnetic emissions memory map and relating levels of electromagnetic emissions to locations on said adjacent body.

24. A method for testing a circuit board for electromagnetic emission therefrom, the method comprising the steps of energizing a circuit supported by the circuit board, addressing an electromagnetic emission monitoring probe located immediately adjacent the board at successive predetermined locations in a grid thereof extending parallel to the board, measuring the current induced in the probe at each successive location using a receiver tuned to a predetermined frequency, directing circuit layout design data to a controller, operating the controller to illustrate the circuit layout at a visual display unit, directing said measured current data to the controller, and operating the controller to illustrate a map of electromagnetic emissions corresponding to said circuit layout at the visual display unit.

25. A method for testing a circuit board for electromagnetic emission therefrom as recited in claim 24 further comprising the step of forming at least one electromagnetic monitoring probe, said probe having at least one wire loop.

* * * * *